United States Patent [19]
Kawasaki et al.

[11] 4,112,439
[45] Sep. 5, 1978

[54] DIGITAL DISPLAY CIRCUIT FOR A PHOTOGRAPHIC EXPOSURE METER

[75] Inventors: Masahiro Kawasaki; Yoshio Sawada, both of Tokyo, Japan

[73] Assignee: Asahi Kogaku Kogyo Kabushiki Kaisha, Tokyo, Japan

[21] Appl. No.: 744,851

[22] Filed: Nov. 24, 1976

[30] Foreign Application Priority Data

Nov. 25, 1975 [JP] Japan .............................. 50-140,917

[51] Int. Cl.² .................... G03B 7/08; G03B 17/20
[52] U.S. Cl. .................... 354/23 D; 354/53; 354/60 R; 354/60 L; 356/226
[58] Field of Search ................ 354/23 D, 53, 60 R, 354/60 L, 289; 340/347 AD; 235/154; 356/226

[56] References Cited
U.S. PATENT DOCUMENTS

| | | | |
|---|---|---|---|
| 3,858,199 | 12/1974 | Neuner et al. | 340/347 AD |
| 3,964,076 | 6/1976 | Ichihashi et al. | 354/60 L |
| 3,968,486 | 7/1977 | Gerdes | 340/347 AD |
| 3,984,832 | 10/1976 | Henry | 340/347 AD |
| 4,051,491 | 9/1977 | Toyoda | 354/53 |

*Primary Examiner*—Russell E. Adams
*Attorney, Agent, or Firm*—Sughrue, Rothwell, Mion, Zinn and Macpeak

[57] ABSTRACT

An analog-to-digital converter circuit for a photographic exposure meter includes a plurality of parallel connected transistors 51, 54, 57 and 60 whose bases are connected to the logarithmic output of a light measuring circuit A. The transistor collectors are driven by constant current sources comprising an equal plurality of transistors 50, 53, 56 and 59 having emitter area ratios of 1:2:4:8, whereby the collector voltages of the transistors represent a digital threshold conversion of the light measuring circuit output.

6 Claims, 6 Drawing Figures

DIGITAL DISPLAY CIRCUIT FOR A PHOTOGRAPHIC EXPOSURE METER

BACKGROUND OF THE INVENTION

This invention relates to a digital display circuit for a photographic exposure meter.

Ammeters have previously been employed as output indicators in prior art photographic expsoure meters. Such ammeters have a slow response time, however, are prone to mechanical vibration damage, and occupy a relatively large space. In order to overcome these difficulties, a number of digital output displays for exposure meters have been developed. However, these conventional digital display type exposure meters suffer from the disadvantage that the manufacturing cost is relatively high because the implementing circuits are intricate and complex. A more detailed development of the prior art will be presented below, with specific reference to FIGS. 2 and 3.

SUMMARY OF THE INVENTION

According to this invention the comparison section in the analog-to-digital converter of a digital exposure meter display circuit is made up of a relatively small number of circuit components as compared with the prior art thereby providing an analog-to-digital converter which is low in cost and yet retains the desirable performance characteristics of the conventional devices.

Briefly, an analog-to-digital converter circuit for a photographic exposure meter includes a plurality of parallel connected transistors whose bases are connected to the logarithmic output of a light measuring circuit. The transistor collectors are driven by constant current sources comprising an equal plurality of transistors having emitter area ratios of 1:2:4:8, whereby the collector voltages of the transistors represent a digital threshold conversion of the light measuring circuit output.

Alternatively, the constant current source transistors may have identical emitter areas and output currents, and the plurality of parallel connected transistors may have emitter area ratios of 8:4:2:1.

Temperature immunization may also be achieved by applying the light measuring circuit output to the base of a first transistor, providing a second transistor whose output voltage is proportional to the collector current of the first transistor, applying said output voltage to the converter transistor bases, and incorporating the second transistor and the converter transistors in an integrated circuit.

DETAILED DESCRIPTION OF THE PREFERRED EMBODIMENTS

Figure 1:
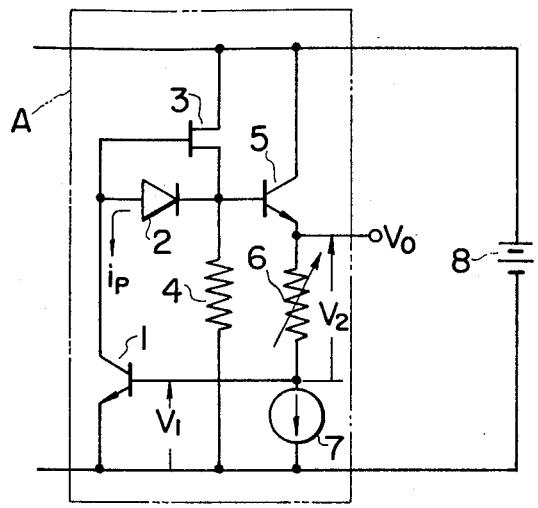
FIG. 1 shows a schematic diagram of a photographic light measuring circuit.

In the photographic light measuring circuit shown in FIG. 1, a logarithmic compression transistor 1 has its collector connected to the gate of a field-effect transistor (FET) 3, which forms a self-biasing circuit with a photo diode 2 and a resistor 4. The source of the FET 3 is connected to the base of a transistor 5, whose emitter is driven by a constant current source 7. Feedback is effected from the emitter of transistor 5 to the base of transistor 1 through a variable resistor 6, whose resistance is set to be proportional to $S_V - T_V - A_V$, where $S_V$ is the apex value of the film sensitivity, $T_V$ is the apex value of the exposure time, and $A_V$ is the apex value of the f-stop or aperture opening.

In operation, feedback is effected from the collector to the base of transistor 1, which is driven in a constant current mode by the photoelectric current $i_p$ of the diode 2, through the FET 3 and transistor 5. As a result, the base-emitter voltage $V_1$ of the transistor 1 corresponds to the apex value $B_V$ of the brightness of an object. Mathematically, the voltage $V_1$ is given by the expression:

$$V_1 = \frac{KT}{q} \ln \frac{i_p}{i_o} + V_{BE(O)}, \quad (1)$$

where:
 $K$ is a Boltzmann constant,
 $T$ is the absolute temperature,
 $q$ is the electron charge, and
 $V_{BE(0)}$ is the base-emitter voltage with a collector current of $i_o$.

The photoelectric current $i_p$ of the diode 2 as a function of the apex value $B_V$ of the object brightness is expressed by the following equation:

$$i_p = i_{po} \cdot 2^{B_V},$$

where $i_{po}$ is the photoelectric current when $B_V = 0$. Thus, equation (1) may be rewritten as follows:

$$V_1 = \frac{KT}{q} \cdot B_V \cdot \ln 2 + \frac{KT}{q} \ln \left(\frac{i_{po}}{i_o}\right) + V_{BE(O)} \quad (2)$$

If the resistance $R_1$ of the variable resistor 6 is selected to satisfy the equation $R_1 = R_S(N + S_V - A_V - T_V)$, where $N$ is a constant and $R_S$ is the resistance per step of the apex value $(S_V - A_V - T_V)$, then the voltage $V_2$ across resistor 6 is:

$$V_2 = R_S(N + S_V - A_V - T_V) \times i_l,$$

where $i_l$ is the current of the constant current source 7.

Now, if $R_S i_l$ is established as being equal to $(KT/q)$ $ln2$, then the voltage $V_2$ across resistor 6 becomes:

$$V_2 = (KT/q)(ln2) \cdot (N + S_V - A_V - T_V) \quad (3)$$

Therefore, the output voltage $V_0$ of the light measuring circuit is:

$$V_0 = V_1 + V_2 = \frac{KT}{q}(\ln 2)(B_V + S_V - A_V - T_V) + \quad (4)$$
$$\frac{KT}{q} \ln \left(\frac{i_{po}}{i_o} \cdot 2^N\right) + V_{BE(O)}$$

Figure 2:
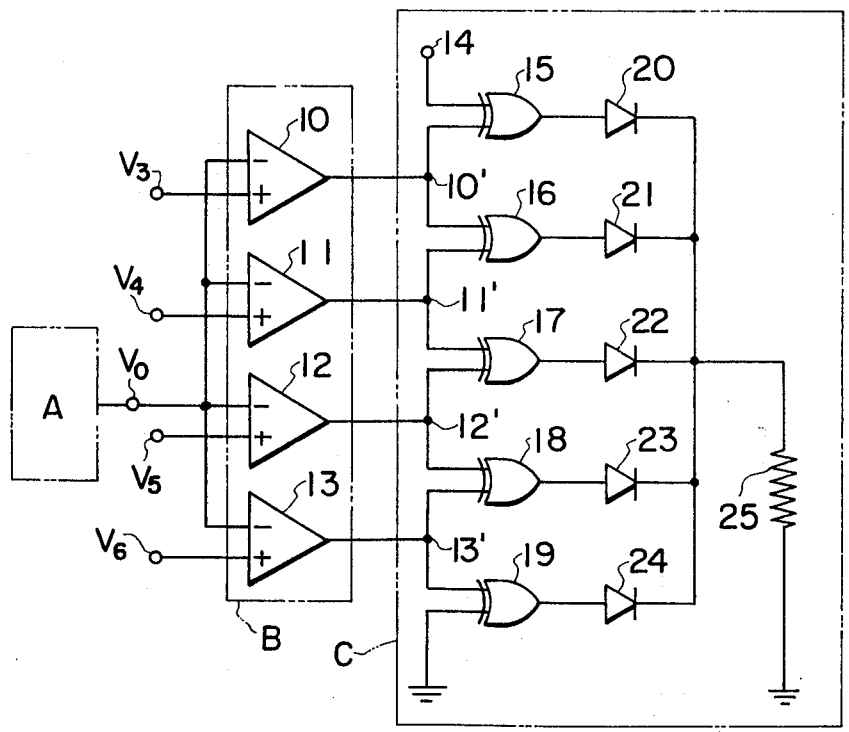
FIG. 2 shows a block diagram of a conventional digital display circuit.

An example of a conventional digital display circuit is shown in FIG. 2, in which the output display is implemented by five light emitting diodes (LED), and suitable exposure conditions are indicated by illuminating the central LED. In this circuit, the output $V_0$ of the light measuring circuit (circuit A) is connected to the negative or inverting input terminal of each of the comparators 10, 11, 12 and 13, and reference voltages $V_3$, $V_4$, $V_5$ and $V_6$ are connected to the positive input terminals thereof. These reference voltages satisfy the relationship that: $V_3 > V_4 > V_5 > V_6$. The circuit further comprises EXCLUSIVE OR circuits 15, 16, 17, 18 and 19, LED's 20, 21, 22, 23 and 24, and a current limiting resistor 25. A high or logic 1 signal is applied to the terminal 14.

In operation, when $V_0 > V_3$ the output levels of the comparators 10, 11, 12 and 13 are all low or at a logic 0, and only the output of EXCLUSIVE OR circuit 15 is high. The remaining EXCLUSIVE OR circuits 16, 17, 18 and 19 are low, and accordingly only LED 20 is illuminated. When $V_3 > V_0 > V_4$ the output of comparator 10 is high and the remaining comparators 11, 12 and 13 are low, and therefore only LED 21 is energized. Similarly, the remaining relationships between the output voltage $V_0$ of circuit A, the outputs of the comparators 10, 11, 12 and 13, and the energized LED in FIG. 2, are as indicated in Table 1 below:

Table 1

| | Comparator output | | | | Energized |
|---|---|---|---|---|---|
| | 10 | 11 | 12 | 13 | LED |
| $V_0 > V_3$ | L | L | L | L | 20 |
| $V_3 > V_0 > V_4$ | H | L | L | L | 21 |
| $V_4 > V_0 > V_5$ | H | H | L | L | 22 |
| $V_5 > V_0 > V_6$ | H | H | H | L | 23 |
| $V_6 > V_0$ | H | H | H | H | 24 |

Thus, if the values of the reference voltages $V_3$, $V_4$, $V_5$ and $V_6$ are properly selected, a fixed point type of exposure meter results which indicates suitable or correct exposure conditions by illuminating, for instance, the central LED 22 for the preset combination of film sensitivity, stop value, and exposure time, and the measured object brightness.

Figure 3:
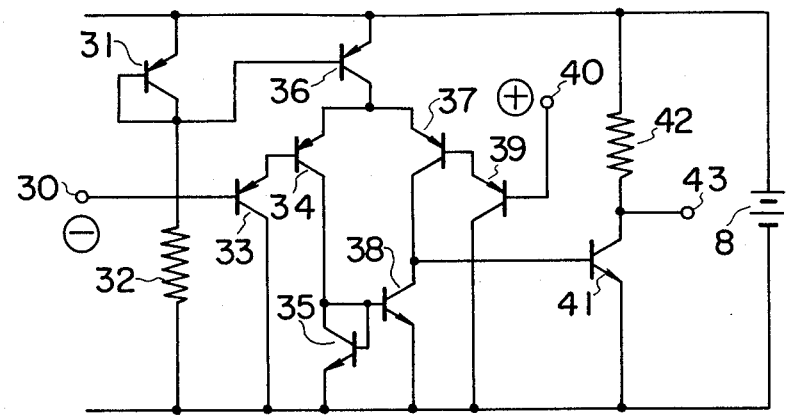
FIG. 3 shows schematic circuit diagram of a conventional comparator.

An embodiment of each of the comparators 10, 11, 12 and 13 shown in FIG. 2 is illustrated in FIG. 3, wherein transistors 33 and 34, and transistors 37 and 39, respectively, are Darlington-connected. The emitters of transistors 34 and 37 are connected together to form a differential amplifier, and are driven in a constant current mode by a transistor 36 which is biased by a series circuit comprising a diode-connected transistor 31 and a resistor 32. Transistors 35 and 38 form an active load circuit, and are respectively connected to the collectors of transistors 34 and 37. The base of a transistor 41 is connected to the common collector of transistors 37 and 38, and the collector of transistor 41 is connected to a resistor 42. The inverting input terminal is designated 30, the non-inverting input terminal is shown at 40, and the output terminal is designated 43.

Since the comparator shown in FIG. 3 is extensively employed in the prior art, the operational description thereof is omitted. Since such a comparator includes a number of active and passive components, the circuitry becomes unavoidably intricate when four comparators are required as in FIG. 2. The chip area is especially increased when the comparators are incorporated in a bipolar integrated circuit. This reduces the yield and increases the cost.

Further, since the output voltage of circuit A above is relatively low, about 18 mV for every step of variation of each of the apex values $B_V$, $A_V$, $S_V$ and $T_V$, it is necessary to set the offset voltages of the comparators at correspondingly low levels, which adversely affects the accuracy of the circuit.

Figure 4:
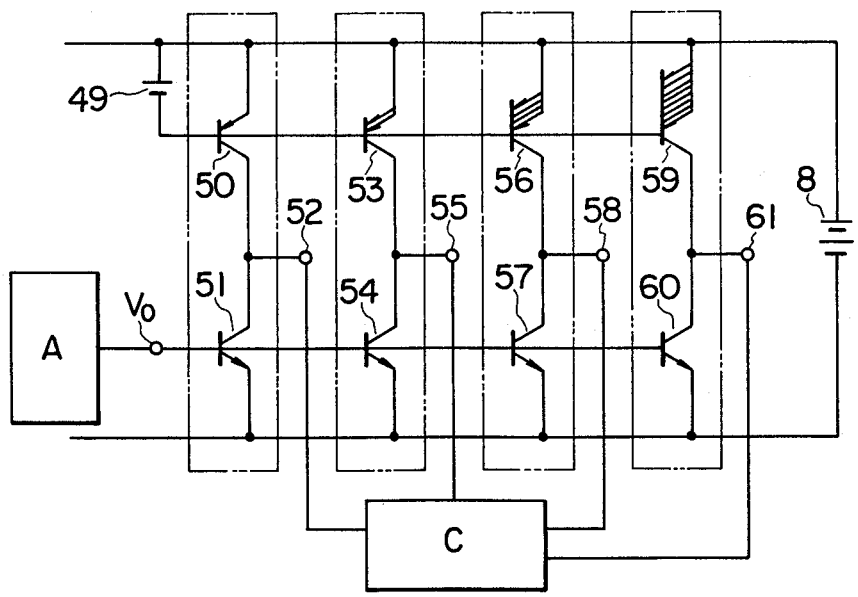
FIGS. 4 and 5 show schematic circuit diagrams of two embodiments of this invention.

These drawbacks and disadvantages of the prior art systems are effectively overcome by the present invention, which will now be described. In FIG. 4, the collectors of common base transistors 50, 53, 56 and 59 are respectively connected to the collectors of common base transistors 51, 54, 57 and 60. A reference voltage 49 is applied to the bases of transistors 50, 53, 56 and 59, while the output voltage $V_0$ of circuit A is applied to the bases of transistors 51, 54, 57 and 60. If the collector currents of the latter transistors are represented by $i_t$, the relation between such collector currents and the input voltage $V_0$ can be expressed by the following equation:

$$V_0 = \frac{KT}{q} \ln\left(\frac{i_t}{i_0}\right) + V_{BE(O)} \qquad (5)$$

Substituting earlier equation (4) into equation (5), the following equation is obtained:

$$\frac{KT}{q} \ln 2 \times (B_V + S_V - A_V - T_V) + \frac{KT}{q} \ln\left(\frac{i_{p(o)}}{i_o} \cdot 2^N\right) = \frac{KT}{q} \ln\left(\frac{i_t}{i_o}\right)$$

The conditions for an optimum exposure are obtained when $B_V + S_V - A_V - T_V = 0$, as is well known from the standard apex system formula. Therefore, the above equation can be rewritten as follows:

$$\ln\left(\frac{i_{p(o)}}{i_o} \cdot 2^N\right) = \ln\left(\frac{i_t}{i_o}\right),$$

which can be reduced to:

$$i_t = i_{p(o)} 2^N \qquad (6)$$

Thus, if N is selected to satisfy equation (6), a current $i_t$ flows in the collectors of transistors 51, 54, 57 and 60 when the optimum exposure conditions are present.

If it is assumed for simplification that the emitter ratio of transistors 50, 53, 56 and 59 is 1:2:4:8, and the collector current of transistor 50 is $i$, then the collector currents of transistors 53, 56 and 59 can be expressed as $2i$, $4i$ and $8i$, respectively.

Now, if the relation between $i_t$ and $i$ determined from equation (6) is set to satisfy equation (7) below, whereby the central LED 22 is energized when the exposure conditions are optimum, the relationship between the energized LED and the measured exposure condition $(B_V + S_V - A_V - T_V)$ is as given in Table 2.

$$i = (i_t/2\sqrt{2} \qquad (7)$$

Thus, a fixed point type of exposure meter is presented.

Table 2

| Relation between $i$ and $i_t$ | Exposure condition $E_V$ | Output terminal | | | | Energized LED |
|---|---|---|---|---|---|---|
| | | 52 | 55 | 58 | 61 | |
| $i_t > 8i$ | more than 2 | L | L | L | L | 20 |

Table 2-continued

| Relation between $i$ and $i_t$ | Exposure condition $E_V$ | Output terminal 52 | 55 | 58 | 61 | Energized LED |
|---|---|---|---|---|---|---|
| $8i > i_t > 4i$ | $1 \pm 0.5$ | L | L | L | H | 21 |
| $4i > i_t > 2i$ | $0 \pm 0.5$ | L | L | H | H | 22 |
| $2i > i_t > i$ | $-1 \pm 0.5$ | L | H | H | H | 23 |
| $i > i_t$ | less than $-2$ | H | H | H | H | 24 |

Block C in FIG. 4 corresponds to block C (encircled by the broken line) in FIG. 2. Reference numerals 10′, 11′, 12′ and 13′ in FIG. 2 correspond to reference numerals 52, 55, 58 and 61 in FIG. 4, respectively.

Figure 5:
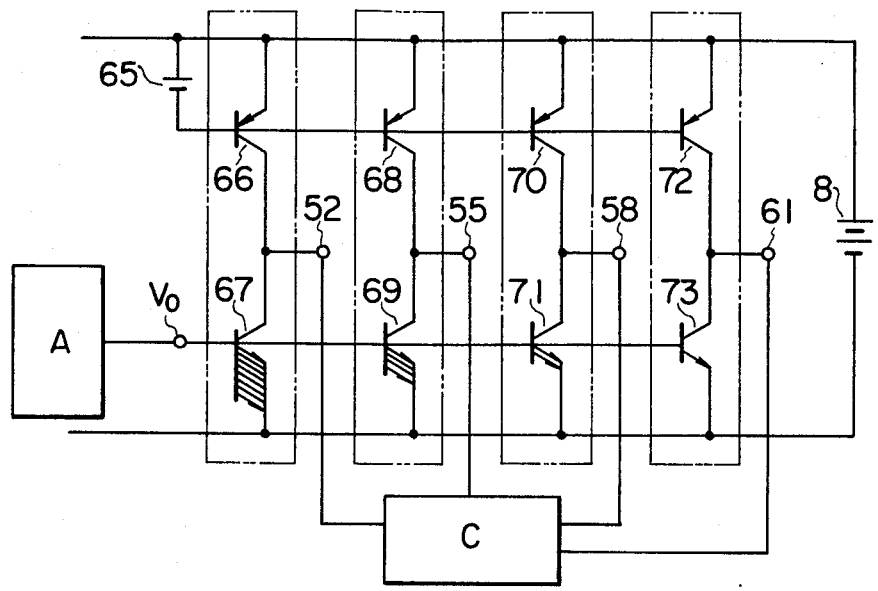

FIG. 5 shows another embodiment of this invention, wherein the collectors of common base transistors 66, 68, 70 and 72 are respectively connected to the collectors of common base transistors 67, 69, 71 and 73. A reference voltage 65 is applied to the bases of transistors 66, 68, 70 and 72, while the output voltage $V_0$ of circuit A is applied to the bases of transistors 67, 69, 71 and 73. The emitter currents of the transistors 66, 68, 70 and 72 are equal, and can be expressed by $i'$. If the emitter ratio of transistors 67, 69, 71 and 73 is 8:4:2:1, and the collector current of transistor 73 is expressed by $i_t'$, then the collector currents of transistors 71, 69 and 67 can be expressed by $2i_t'$, $4i_t'$ and $8i_t'$. Now if the relation between $i'$ and $i_t'$ is established as $i' = 2\sqrt{2}i_t'$, then equation (5) can be established with respect to the emitter current. Therefore, similarly as in the case of FIG. 4, the relationship between the measured exposure condition $(B_V + S_V - A_V - T_V)$ and the energized LED is as shown in Table 2, and a fixed point type of exposure meter is again presented. Block C in FIG. 5 is identical to that in FIG. 4.

From a different point of view, as is clear from equation (5), the respective 2-fold or ½-fold collector current changes of transistors 51, 54, 57 and 60 in FIG. 4 or emitter current changes of transistors 67, 69, 71 and 73 in FIG. 5 result in respective changes of $hln2$ (about 18 mV at room temperature) of the emitter-base voltages $V_{BE}$ of these transistor groups, where h is the transistor amplification factor. Thus, a group of comparators whose threshold values differ by $hln2$ is obtained. Where this circuit is built into in a camera, for instance, due to the compression characteristic of transistor 1, that is, the $i_p(=i_c)$ vs. $V_{BE}$ characteristic, the linearity of the minute current component $i_p$ cannot be consistently obtained by an integrated circuit transistor, and therefore this transistor must be incorporated as a separate component. However, it is desirable that the other components, including the comparators, be included in an integrated circuit as far as possible, at least to the extent that such inclusion does not make it impossible to build the circuit into the camera. Since equation (6) has no terms dependent upon temperature, the circuit of the invention is immune to errors due to temperature changes. However, if as described above the transistor 1 is incorporated as a separate component and the other components, including the comparators, are produced as an integrated circuit, this integrated circuit will generate heat when a relatively large current flows therein to illuminate an LED. As a result, the threshold levels of transistors 51, 54, 57 and 60 may change, and the matching of these transistors with transistor 1 may also vary, which may result in a display error. Furthermore, since the temperature of the integrated circuit gradually increases because of the heat capacity of the integrated circuit package, and it thus takes some time until steady state heat saturation is reached, the output display may also change with time.

Figure 6:
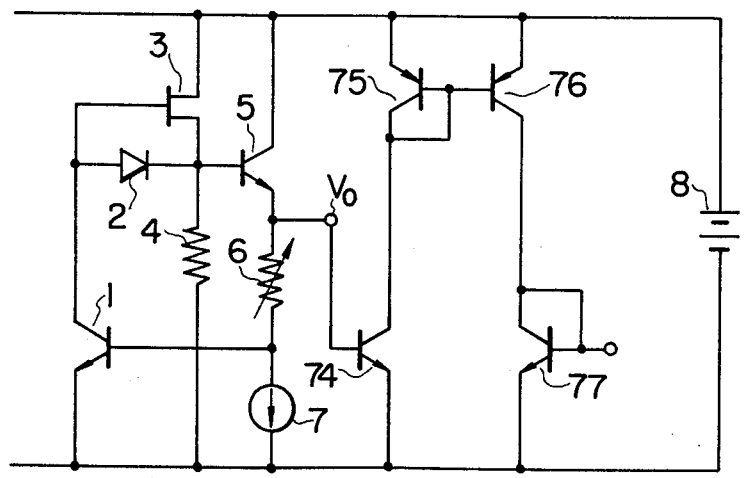
FIG. 6 shows a schematic circuit diagram of another embodiment of the invention formed as an integrated circuit.

These disadvantages can be eliminated by the circuit shown in FIG. 6. Elements 1 through 7 in FIG. 6 are the same in both structure and functioning as those in FIG. 1. In the circuit shown in FIG. 6, the base of a transistor 74 is connected to the emitter of transistor 5, and the collector of transistor 74 is connected to the collector of a transistor 75, with which a transistor 76 forms a current conversion circuit. The collector of a diode-connected transistor 77 is connected to the collector of transistor 76. If the $i_c$ vs. $V_{BE}$ characteristics of transistors 74 and 77 and transistors 75 and 76 are the same, then since the base-emitter voltage $V_{BE}$ of transistor 74 corresponds to $V_0$ (equation (5)), the collector current of transistor 74 is a logarithmic expansion current $i_x$. The same current $i_x$ also flows in the collector of transistor 77 due to the constant current circuit formed by transistors 75 and 76, and therefore the logarithmically compressed base-emitter voltage of transistor 77 is the same as $V_0$. If transistor 74 is incorporated as a separate component in a similar manner as transistor 1, and transistor 77 is formed in an integrated circuit together with the comparators, then the base voltage $V_0$ of transistor 77 can be represented by equation (8) below, and equation (9) can be obtained by cancellation in equations (5) and (8).

$$V_0 = \frac{KT}{q} \ln \frac{i_x}{i_o} V_{BE(O)} \qquad (8)$$

$$\frac{KT}{q} \ln \frac{i_x}{i_o} + V_{BE} = \frac{KT}{q} \ln \frac{i_t}{i_o} + V_{BE}$$

$$i_x = i_t \qquad (9)$$

Since $i_x$ is defined from the base voltage $V_0$ of transistor 74 which is a separate component, and is not affected by temperature changes due to heat generated in the integrated circuit, the LED display is therefore immune to temperature effects. Where transistors 75 and 76 are paired, their performance remains unchanged whether they are included as separate components or in the integrated circuit. Furthermore, if the emitter ratios of transistors 74, 75, 76 and 77 are suitably selected, then level shifting or amplification can be effected.

As is well known in the art, the $h_{FE}$ and $V_{BE}$ characteristics of a transistor in an integrated circuit never fluctuate, and the characteristics of adjacent transistors always remain the same. Therefore, transistors 51, 54, 57 and 60 in FIG. 4, or transistors 66, 68, 70 and 72 in FIG. 5, can be provided with the same characteristics. In addition, transistors 50, 53, 56 and 59 in FIG. 4, or transistors 67, 69, 71 and 73 in FIG. 5, can be made to have the same characteristics per unitary emitter area. Therefore, even if the characteristics of transistors in different integrated circuits are not uniform, a constant threshold level difference can always be maintained.

What is claimed is:

1. An analog-to-digital converter circuit for a photographic exposure meter, comprising;
   a. a light measuring circuit for producing an output voltage proportional to the logarithm of the brightness of an object as a function of predetermined photographic parameters,
   b. a plurality of transistors connected in parallel and having equal emitter areas, c. means connecting the output voltage of said light measuring circuit to the base of each of said transistors, d. an equal plurality of constant current sources for producing output currents differing from each other in accordance with a predetermined ratio, and e. means individually connecting the outputs of said constant current sources to the collectors of said plurality of transistors, whereby the voltages produced at the collectors of said plurality of transistors represent a digital threshold conversion of the output voltage of said light measuring circuit in accordance with said predetermined ratio.

2. A circuit as defined in claim 1, wherein said plurality of constant current sources comprises a plurality of transistors having respective emitter area ratios of 1:2:4:8.

3. A circuit as defined in claim 1, wherein said light measuring circuit includes a first transistor, means for applying a voltage proportional to the logarithm of the brightness of an object as a function of predetermined photographic parameters to the base of said first transistor, and a second transistor for producing an output voltage proportional to the collector current of said first transistor, and wherein said second transistor and said plurality of transistors are incorporated in an integrated circuit.

4. An analog-to-digital converter circuit for a photographic exposure meter, comprising:

a. a light measuring circuit for producing an output voltage proportional to the logarithm of the brightness of an object as a function of predetermined photographic parameters, b. a plurality of transistors connected in parallel and having emitter areas differing from each other in accordance with a predetermined ratio, c. means connecting the output voltage of said light measuring circuit to the base of each of said transistors, d. an equal plurality of constant current sources for producing equal output currents, and e) means individually connecting the outputs of said constant current sources to the collectors of said plurality of transistors, whereby the voltages produced at the collectors of said plurality of transistors represent a digital threshold conversion of the output voltage of said light measuring circuit in accordance with said predetermined ratio.

5. A circuit as defined in claim 4, wherein said plurality of transistors have emitter area ratios of 8:4:2:1.

6. A circuit as defined in claim 4, wherein said light measuring circuit includes a first transistor, means for applying a voltage proportional to the logarithm of the brightness of an object as a function of predetermined photographic parameters to the base of said first transistor, and a second transistor for producing an output voltage proportional to the collector current of said first transistor, and wherein said second transistor and said plurality of transistors are incorporated in an integrated circuit.

* * * * *